Jan. 26, 1971 L. EGERTON ET AL 3,559,116
PIEZOELECTRIC CERAMIC FILTER
Filed June 6, 1969
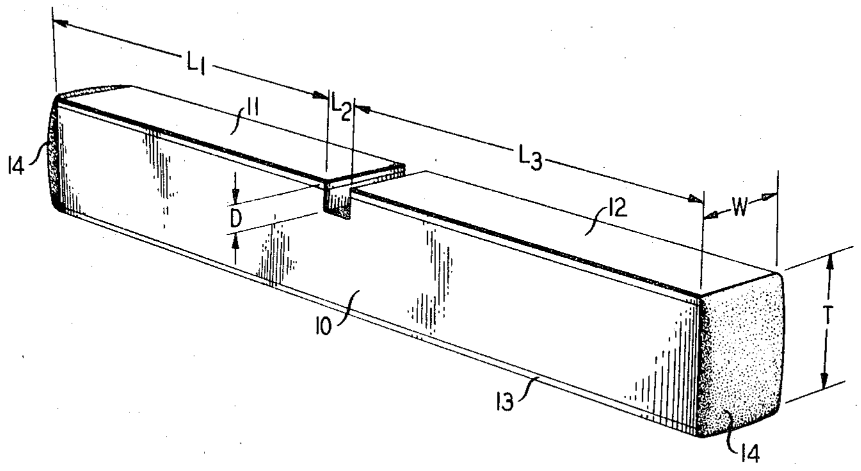
INVENTORS L. EGERTON
T. R. MEEKER
J. D. TAUKE
BY [signature]
ATTORNEY United States Patent Office 3,559,116

Patented Jan. 26, 1971

3,559,116

PIEZOELECTRIC CERAMIC FILTER

Lawson Egerton, Basking Ridge, N.J., and Thrygve R. Meeker and John D. Tauke, Allentown, Pa., assignors to Bell Telephone Laboratories, Incorporated, Murray Hill and Berkeley Heights, N.J., a corporation of New York Filed June 6, 1969, Ser. No. 831,033

Int. Cl. H03h 7/10

U.S. Cl. 333—72 8 Claims

ABSTRACT OF THE DISCLOSURE

A piezoelectric ceramic filter is disclosed which comprises a pair of mechanically coupled piezoelectric ceramic resonators, each having a rectangular cross section with a thickness in the direction of polarization equal to a half wavelength at the operating frequency, a width of less than one-half the thickness and a length in the direction of coupling in excess of ten times the width. This filter has been found to be free of spurious transmission for frequencies as high as several times the center frequency. Moreover, when the filter is made from a ternary ceramic of $PbTiO_3$, $PbZrO_3$ and $PbMg_{1/3}Nb_{2/3}O_3$, it is substantially stable over a wide range of temperatures.

BACKGROUND OF THE INVENTION

This invention relates to a piezoelectric ceramic filter.

There are innumerable instances in the electrical and communications fields where it is desirable to couple two electrical circuits together in such a fashion that only a predetermined, limited band of frequencies passes through the coupling. While this function can be performed by lumped parameter circuit devices, significant reductions in both cost and size have been shown to accrue from the use of a piezoelectric filter. (See, for example, R. A. Sykes and W. L. Smith, "A Monolithic Crystal Filter," 46 Bell Laboratories Record 52, 1968.)

A typical piezoelectric filter comprises a crystalline quartz wafer including a pair of resonators and a pair of electrodes associated with each of the resonators. The wafer is typically cut so that an electrical signal containing frequency components near the resonant frequency excites a transverse shear wave in the resonator. This shear wave is mechanically coupled to the second resonator which converts it back into an electrical signal principally comprising those frequencies of the electrical input signal near the resonant frequency.

One difficulty with prior art piezoelectric filters, however, is the presence of spurious transmissions, such as harmonics of the desired resonant frequencies, in the output. These spurious transmissions limit the useful bandwidth of the filter and introduce unwanted frequency components into the output.

A second problem which arises in connection with piezoelectric filters is that of temperature instability. For many piezoelectric filters the transmitted frequency is a function of temperature, and while such filters may be quite useful in environments which are of a relatively constant temperature—such as in an inhabited building—they are of only limited utility in less protected environments.

SUMMARY OF THE INVENTION

In accordance with the present invention, a piezoelectric filter comprises a pair of mechanically coupled piezoelectric ceramic resonators, each having a rectangular cross section; a thickness in the direction of polarization equal to a half wavelength of an elastic wave at the desired center frequency; a width of less than three-quarters the thickness; a length in excess of ten times the width. With such a geometry, only the lowest order width-to-thickness mode (which has no harmonics) is easily excited in the resonators, and the filter is therefore free of spurious transmissions for frequencies as high as several times the center frequency. Moreover, it has been discovered that when the filter is made from a ternary ceramic of $PbTiO_3$, $PbZrO_3$ and $PbMg_{1/3}Nb_{2/3}O_3$, it is substantially temperature stable.

BRIEF DESCRIPTION OF THE DRAWINGS

The nature of the present invention and its various features will appear more fully upon consideration of the illustrative embodiments to be described in detail in connection with the accompanying drawing in which:

The figure is a perspective view of one embodiment of a piezoelectric filter in accordance with the invention comprising a notched bar 10 of a piezoelectric ceramic material such as, for example, the ternary ceramic to be described in greater detail below, a metal input electrode 11, an output electrode 12 and a common ground electrode 13. The electrodes are typically the chrome-gold-nickel composite layered structures well-known in the art.

Notched bar 10 has a rectangular cross section. The thickness, T, of the bar in the direction of polarization is such that thickness of the structure, including the thin electrodes, is one-half wavelength of an elastic wave at the operating frequency. The width, W, is advantageously less than 0.75T so that only the lowest order width-thickness mode is easily excited, thereby substantially eliminating spurious transmission. (At this width, the next higher mode is about 20 decibels down.) Advantageously the width is 0.5T so that, insofar as is known, no higher order modes can be excited. The lengths $L_1$ and $L_3$ covered by the input and output electrodes are at least 10W to suppress length resonances.

With the dimensions so chosen with respect to the direction of polarization, the portions of the bar 10 under electrodes 11 and 12 act as resonators at the chosen center frequency. These resonators are defined and mechanically coupled together by a notched portion of length $L_2$ and depth $d$. In general, $L_2$ is less than three-quarters of a wavelength to prevent the introduction of unwanted modes. For a filter having a maximum bandwidth, $L_2$ is either a half wavelength or as small as practical consistent with electrically separating the electrodes, typically less than one-tenth of a wavelength. The depth, $d$, of the notch for a maximum bandwidth filter is simply the thickness of the electrodes. For a minimum bandwidth filter, $L_2$ is a quarter wavelength and $d$ is as deep as possible consistent with the amount of loss which the system can tolerate. A depth of more than one-quarter of the thickness will usually be required. For intermediate bandwidths, the coupling, and hence the bandwidth, varies smoothly with the length and decreases with increasing depth.

The lengths $L_1$ and $L_3$ of the input and output electrodes are typically equal. However, by making them unequal, the filter can also be made to act as a voltage transformer. In particular, the ratio of input voltage amplitude to output voltage amplitude is approximately equal to the ratio of $L_1$ to $L_3$ for proper electrical termination conditions.

Advantaegously, the ends of the bar are covered with a sound dissipating material 14 such as epoxy to prevent the buildup of longitudinal standing waves.

As previously mentioned, a ternary ceramic of $PbMg_{1/3}Nb_{2/3}O_3$, $PbTiO_3$ and $PbZrO_3$ has been found particularly advantageous for this application because it produces a filter which is very stable with respect to temperature changes. This ceramic is made using conventional ceramic formation processes well known in the art. Compositions having between 50 and 60 mole percent $PbMg_{1/3}Nb_{2/3}O_3$, 30 and 45 percent $PbTiO_3$ and 1 and 10 percent $PbZrO_3$ have been found to be useful and it is expected that even broader ranges of the composition will be useful for some temperature ranges. In addition, it has been noted that the Q of the filter can be increased by the addition of dopants such as $MnO_2$.

In order that the invention may be more fully illustrated, a specific example will now be set forth in greater detail. One filter was constructed from a ceramic comprising 57 mole percent $PbMg_{1/3}Nb_{2/3}O_3$, 37 percent $PbTiO_3$ and 6 percent $PbZrO_3$. This ceramic was then doped with one weight percent of $MnO_2$. It was then polarized at a voltage of 100 volts per mill of thickness at 100° C. for 30 minutes. The temperature was then reduced to 60° C. and the voltage removed. The ceramic was then machined and polished into a 0.048 inch x 0.024 inch x 0.8 inch bar with a 0.005 inch ($L_2$) x 0.005 inch (d) notch 0.3 inch from one end of the bar. Chrome-gold-nickel electrodes were used with the input electrode being 0.3 inch and the output electrode approximately 0.5 inch. Globs of epoxy were disposed on both ends. The bandwidth of the filter was 12.7 kHz. at a center frequency of 1,544.8 kHz.

The input capacitance was 82 picofarads and the input drive was 65 ohms. The output capacitance was 52 picofarads and the output impedance was 1050 ohms. The voltage gain of the filter was 10 decibels. The phase shift across the transmission band was 360°. Temperature studies revealed that the center frequency of the filter varied less than one-half of one percent for temperature variations between −40° C. and 85° C.

What is claimed is:

1. A piezoelectric ceramic filter comprising:

a bar of piezoelectric ceramic material having a rectangular cross-section with a thickness in the direction of polarization substantially equal to a half wavelength of an elastic wave at the desired center frequency and a width of less than three-quarters the thickness;

a pair of electrodes disposed on one surface of said bar perpendicular to the direction of polarization, and separated by a distance of less than three-quarters of a wavelength, and each having a length of at least ten times the width of the bar; and a common ground electrode on the other surface perpendicular to the direction of polarization.

2. A filter according to claim 1 wherein said pair of electrodes are separated by a distance of one-half wavelength.

3. A filter according to claim 1 wherein said pair of electrodes are separated by a distance of one-quarter wavelength.

4. A filter according to claim 1 wherein said pair of electrodes are separated, but by a distance of less than one-tenth of a wavelength.

5. A filter according to claim 1 wherein said width is less than one-half the thickness in the direction of polarization.

6. A filter according to claim 1 wherein the piezoelectric material is a ternary ceramic of $PbMg_{1/3}Nb_{2/3}O_3$, $PbTiO_3$, and $PbZrO_3$.

7. A filter according to claim 5 wherein said ternary ceramic comprises 50–60 mole percent $PbMg_{1/4}Nb_{2/3}O_3$, 30–45 mole percent $PbTiO_3$ and 1–10 mole percent $PbZro_3$.

8. A filter according to claim 6 wherein said piezoelectric ceramic is 57 mole percent $PbMg_{1/3}Nb_{2/3}O_3$, 37 mole percent $PbTiO_3$ and 6 mole percent $PbZro_3$ and is doped with one weight percent of $MnO_2$.

References Cited

UNITED STATES PATENTS

| | | | |
|---|---|---|---|
| 2,276,013 | 3/1942 | Bohannon | 333—72 |
| 2,309,467 | 1/1943 | Mason | 333—72X |
| 2,373,431 | 4/1945 | Sykes | 333—72 |
| 3,297,968 | 1/1967 | Fowler | 333—72 |
| 3,408,514 | 10/1968 | Adamietz et al. | 333—72X |
| 3,408,515 | 10/1968 | Morse | 333—72X |

HERMAN KARL SAALBACH, Primary Examiner

T. VEZEAN, Assistant Examiner

U.S. Cl. X.R.

310—9.6, 9.8